(12) United States Patent
Xu et al.

(10) Patent No.: US 12,198,902 B2
(45) Date of Patent: Jan. 14, 2025

(54) LAMINATED AEROSOL DEPOSITION COATING FOR ALUMINUM COMPONENTS FOR PLASMA PROCESSING CHAMBERS

(71) Applicant: Lam Research Corporation, Fremont, CA (US)

(72) Inventors: Lin Xu, Fremont, CA (US); John Daugherty, Fremont, CA (US); Satish Srinivasan, Newark, CA (US); David Joseph Wetzel, Santa Clara, CA (US)

(73) Assignee: Lam Research Corporation, Fremont, CA (US)

( * ) Notice: Subject to any disclaimer, the term of this patent is extended or adjusted under 35 U.S.C. 154(b) by 500 days.

(21) Appl. No.: 17/432,003

(22) PCT Filed: Mar. 3, 2020

(86) PCT No.: PCT/US2020/020757
§ 371 (c)(1),
(2) Date: Aug. 18, 2021

(87) PCT Pub. No.: WO2020/180853
PCT Pub. Date: Sep. 10, 2020

(65) Prior Publication Data
US 2022/0115214 A1    Apr. 14, 2022

Related U.S. Application Data

(60) Provisional application No. 62/814,022, filed on Mar. 5, 2019.

(51) Int. Cl.
*B32B 15/04* (2006.01)
*B32B 17/06* (2006.01)
(Continued)

(52) U.S. Cl.
CPC .. *H01J 37/32495* (2013.01); *H01J 37/32559* (2013.01); *C23C 24/04* (2013.01); *H01L 21/68757* (2013.01)

(58) Field of Classification Search
CPC .................................................. H01J 37/32495
(Continued)

(56) References Cited

U.S. PATENT DOCUMENTS

| 6,776,873 B1 * | 8/2004 | Sun ......................... C23C 28/00 |
| | | 118/723 R |
| 7,371,467 B2 * | 5/2008 | Han .................. H01J 37/32477 |
| | | 118/506 |

(Continued)

FOREIGN PATENT DOCUMENTS

| EP | 1847628 | 10/2007 |
| JP | 2005-158933 | 6/2005 |

(Continued)

OTHER PUBLICATIONS

International Search Report from International Application No. PCT/US2020/020757 dated Jun. 19, 2020.

(Continued)

*Primary Examiner* — Lauren R Colgan
(74) *Attorney, Agent, or Firm* — Beyer Law Group LLP

(57) ABSTRACT

An apparatus adapted for use in a plasma processing chamber is provided. An aluminum body with at least one surface is provided. An aluminum oxide containing aerosol deposition coating is disposed over the at least one surface of the aluminum body. An yttrium containing aerosol deposition coating is disposed over the aluminum oxide containing aerosol deposition coating.

8 Claims, 3 Drawing Sheets

(51) Int. Cl.
*H01J 37/32* (2006.01)
*C23C 24/04* (2006.01)
*H01L 21/687* (2006.01)

(58) Field of Classification Search
USPC .......................................................... 428/471
See application file for complete search history.

(56) References Cited

U.S. PATENT DOCUMENTS

| | | | | |
|---|---|---|---|---|
| 8,114,473 | B2* | 2/2012 | Iwasawa | C23C 16/4404 |
| | | | | 427/427 |
| 8,124,240 | B2* | 2/2012 | Ohmi | C25D 11/02 |
| | | | | 428/472 |
| 9,708,713 | B2* | 7/2017 | Sun | C23C 24/04 |
| 2004/0002221 | A1 | 1/2004 | O'Donnell et al. | |
| 2004/0191545 | A1* | 9/2004 | Han | C23C 28/34 |
| | | | | 428/472 |
| 2005/0037193 | A1* | 2/2005 | Sun | C23C 4/18 |
| | | | | 427/446 |
| 2005/0106403 | A1* | 5/2005 | Yui | C23C 22/361 |
| | | | | 427/430.1 |
| 2005/0112289 | A1* | 5/2005 | Trickett | H01J 37/32477 |
| | | | | 427/446 |
| 2005/0150866 | A1* | 7/2005 | O'Donnell | H01J 37/32477 |
| | | | | 156/345.43 |
| 2008/0108225 | A1* | 5/2008 | Sun | C23C 16/4404 |
| | | | | 438/758 |
| 2011/0206833 | A1* | 8/2011 | Sexton | H01J 37/32862 |
| | | | | 427/78 |
| 2014/0030486 | A1* | 1/2014 | Sun | H01J 37/32495 |
| | | | | 428/697 |
| 2014/0154465 | A1* | 6/2014 | Sun | H01L 21/6831 |
| | | | | 156/89.12 |
| 2014/0349073 | A1* | 11/2014 | Sun | H01J 37/3244 |
| | | | | 428/432 |
| 2016/0312351 | A1 | 10/2016 | Liu et al. | |
| 2018/0135157 | A1* | 5/2018 | Jeong | C23C 4/123 |
| 2018/0330923 | A1* | 11/2018 | Tran | C23C 16/04 |

FOREIGN PATENT DOCUMENTS

| | | |
|---|---|---|
| JP | 2013-542612 | 11/2013 |
| TW | 200412827 | 7/2004 |
| TW | 200820325 | 5/2008 |
| TW | 201501204 | 1/2015 |
| TW | 201726975 | 8/2017 |
| WO | 2004/003962 | 1/2004 |
| WO | 2012-057963 | 3/2012 |

OTHER PUBLICATIONS

Written Opinion from International Application No. PCT/US2020/020757 dated Jun. 19, 2020.
Japanese Office Action from Japanese Application No. 2021-551543 dated Jan. 23, 2024 with Machine Translation.
Taiwanese Office Action from Taiwanese Application No. 109107171 dated Oct. 19, 2023 with Machine Translation.
Taiwanese 2$^{nd}$ Office Action from Taiwanese Application No. 109107171 dated Mar. 14, 2024 with Machine Translation.
Taiwanese 3$^{rd}$ Office Action from Taiwanese Application No. 109107171 dated Jul. 12, 2024 with Machine Translation.
Japanese Decision of Refusal from Japanese Application No. 2021-551543 dated Aug. 6, 2024 with Machine translation.

* cited by examiner

LAMINATED AEROSOL DEPOSITION COATING FOR ALUMINUM COMPONENTS FOR PLASMA PROCESSING CHAMBERS

CROSS-REFERENCE TO RELATED APPLICATION

This application claims the benefit of priority of U.S. Application No. 62/814,022, filed Mar. 5, 2019, which is incorporated herein by reference for all purposes.

BACKGROUND

The present disclosure generally relates to the manufacturing of semiconductor devices. More specifically, the disclosure relates to plasma chamber components used in manufacturing semiconductor devices.

During semiconductor wafer processing, plasma processing chambers are used to process semiconductor devices. Aluminum components of plasma processing chambers are subjected to plasmas. The plasma may degrade the component.

SUMMARY

To achieve the foregoing and in accordance with the purpose of the present disclosure, an apparatus adapted for use in a plasma processing chamber is provided. An aluminum body with at least one surface is provided. An aluminum oxide containing aerosol deposition coating is disposed over the at least one surface of the aluminum body. An yttrium containing aerosol deposition coating is disposed over the aluminum oxide containing aerosol deposition coating.

In another manifestation, a method for coating a plasma processing chamber component is provided. An aluminum oxide containing coating is aerosol deposited on at least one surface of the plasma processing chamber component. An yttrium containing coating is aerosol deposited over the aluminum oxide containing coating.

These and other features of the present disclosure will be described in more detail below in the detailed description of the disclosure and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION

The present disclosure will now be described in detail with reference to a few preferred embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well-known process steps and/or structures have not been described in detail in order to not unnecessarily obscure the present disclosure.

Coated components are used in plasma processing chambers. Since bare aluminum is easily polished, bare aluminum is a common component material for providing coated components. The bare aluminum must be sufficiently coated to protect the bare aluminum from plasma.

Figure 1:
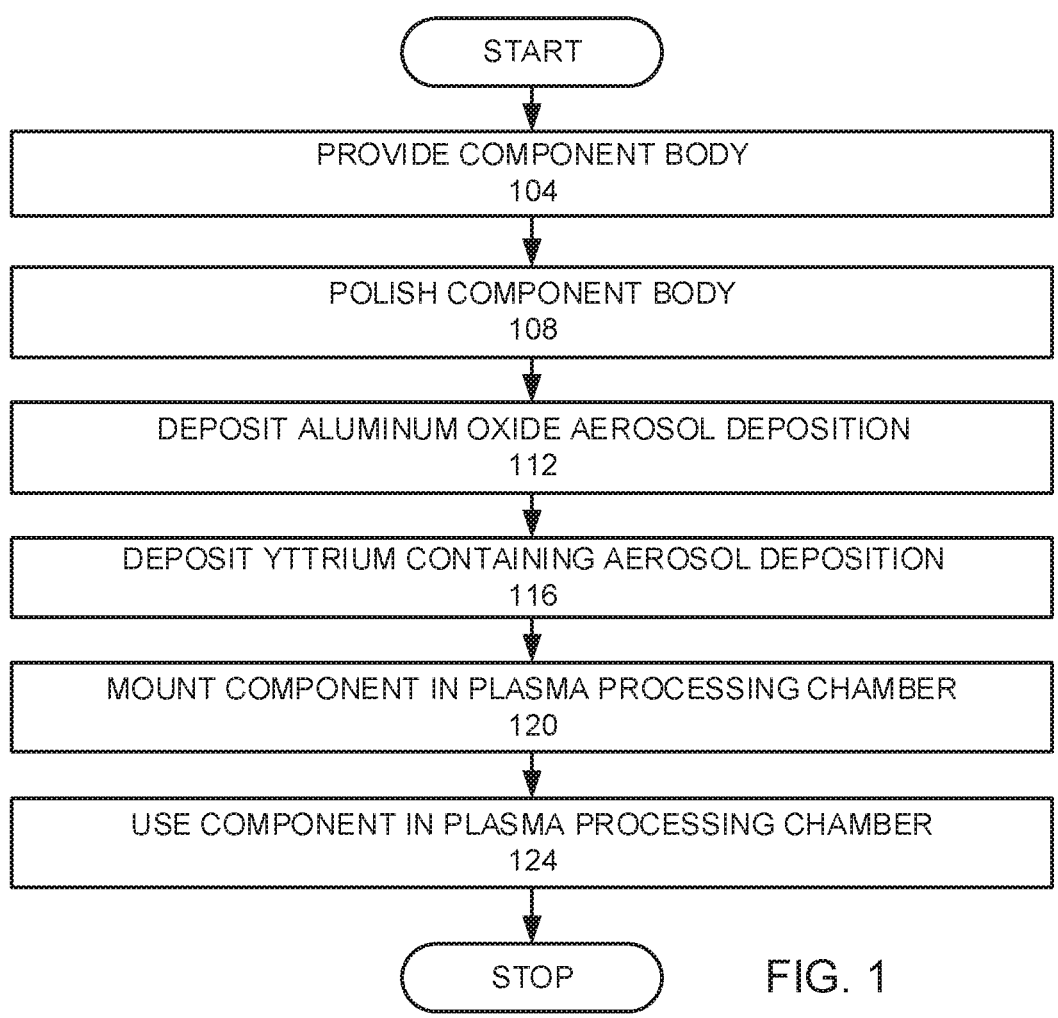
FIG. 1 is a high level flow chart of an embodiment.
Figure 2A:
FIGS. 2A-C are schematic views of a component processed according to an embodiment.

To facilitate understanding, FIG. 1 is a high level flow chart of a process used in an embodiment. A component body is provided (step 104). FIG. 2A is a schematic cross-sectional view of part of a component body 204. The component body 204 is an aluminum body. In this example, the aluminum body is at least 95% pure aluminum by weight. For example, the aluminum body is made of Al 6061. Generally, the aluminum body is either pure aluminum or an aluminum alloy. Generally, the aluminum alloy is at least 95% pure aluminum by weight.

After the component body 204 is provided, at least one surface of the component body 204 is polished (step 108). In this example, the top surface of the component body 204 is polished. Since the component body 204 is at least 95% pure aluminum, the surface is soft enough to polish. The polishing provides a surface roughness of no more than 16 Ra (microinches). In other embodiments, the polishing provides a surface roughness of no more than 10 Ra. In other embodiments, the polishing provides a surface roughness of no more than 5 Ra.

Figure 2B:
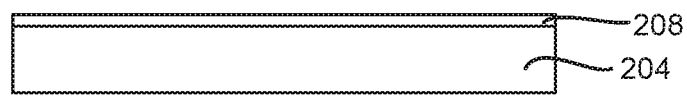

After the component body 204 is polished (step 108), an aluminum oxide ($Al_2O_3$) aerosol deposition coating is deposited on the polished at least one surface of the component body 204 (step 112). Aerosol deposition is achieved by passing a carrier gas through a fluidized bed of solid ceramic particles. Driven by a pressure difference, the solid ceramic particles are accelerated through a nozzle, forming an aerosol jet at its outlet. The aerosol jet is then directed at the polished at least one surface of the component body 204, where the aerosol jet impacts the surface with high velocity. The solid particles break up into solid nanosized fragments, forming a coating. Optimization of carrier gas species, gas consumption, standoff distance, and scan speed provides high quality coatings. FIG. 2B is a schematic cross-sectional view of the part of the component body 204 after the aluminum oxide aerosol deposition coating 208 has been deposited on the polished at least one surface of the component body 204.

Figure 2C:
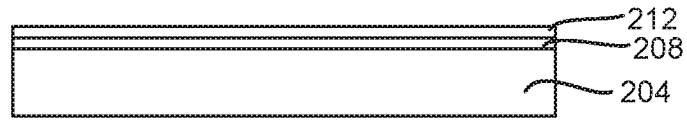

After the aluminum oxide aerosol deposition coating is deposited (step 112), an yttrium containing aerosol deposition coating is deposited on the aluminum oxide aerosol deposition coating 208 (step 116). In this example, the yttrium containing aerosol deposition coating comprises yttria ($Y_2O_3$). In other embodiments, the yttrium containing aerosol deposition coating comprises at least one of yttrium oxyfluoride (YOF), yttrium aluminum oxide, yttria stabilized zirconia (YSZ), and yttrium (III) fluoride ($YF_3$). Yttrium aluminum oxide generally describes many materials, such as a yttrium aluminum garnet ($Y_3Al_5O_{12}$ (YAG)), yttrium aluminum monoclinic ($Y_4Al_2O_9$ (YAM)), and yttrium aluminum perovskite ($YAlO_3$ (YAP)). FIG. 2C is a schematic cross-sectional view of the part of the component body 204 after the yttrium containing aerosol deposition coating 212 has been deposited on the aluminum oxide aerosol deposition coating 208.

After the yttrium containing aerosol deposition coating 212 has been deposited (step 116), the formation of a protective coating is complete and the component body 204 is mounted in a plasma processing chamber (step 120). The plasma processing chamber is used to process a substrate (step 124), where a plasma is created within the chamber to process a substrate, such as etching the substrate. The yttrium containing aerosol deposition coating 212 is exposed to the plasma.

Various aspects of coating the component body 204 provide a more etch resistant coating. The aerosol deposition process relying on the energetic impact of submicron solid ceramic powders with a substrate results in a coating with a density of greater than 95% by volume of the bulk ceramic. The aerosol deposition process typically provides multiple passes where the first pass is used to anchor the coating into the substrate for adhesion. Successive passes are used to build up the thickness of the coating.

Thermally sprayed yttria has a relatively higher porosity. Without being bound by theory, it is believed that aerosol deposition of yttria provides a coating with a much lower porosity than thermally sprayed yttria. The density of the aerosol deposition coating is dependent on the hardness of the substrate. If an aerosol deposition of yttria is deposited directly on aluminum, it is believed that the first coat may penetrate into the soft aluminum component body 204 surface to obtain the desired adhesion. However, during subsequent coating passes, the fracture and impact of the yttria aerosol deposition powder may not be as effective, due to the low hardness of the yttria anchor layer and the soft aluminum component body 204. The soft aluminum body dampens the collision energy.

In the above embodiment, an aluminum oxide aerosol deposition coating 208 is deposited on the aluminum component body 204. The aluminum oxide aerosol deposition coating 208 forms an anchoring layer that is harder than an yttria aerosol deposition coating. Aluminum oxide has a Vickers hardness of 2085. Yttria has a Vickers hardness of 700. Due to the high hardness of aluminum oxide, the aluminum oxide aerosol deposition coating 208 implants deeper into the surface of the component body 204, creating a highly interlocked interface with a stronger bond. The anchoring layer also provides a solid foundation for the subsequent yttria aerosol deposition, providing more effective fracture and plastic deformation. The aluminum oxide aerosol deposition coating 208 has a better chemical resistance than the yttrium containing aerosol deposition coating 212. More specifically, the improved chemical resistance provides a superior diffusion barrier to wet chemistries. The superior diffusion barrier, in turn, provides an improved part lifetime when the component body 204 is exposed to wet cleaning processes.

The subsequent yttria aerosol deposition causes the yttrium containing aerosol deposition coating 212 to become denser than if the yttrium containing aerosol deposition was deposited on bare aluminum.

In various embodiments, the yttrium containing aerosol deposition coating 212 has a thickness in the range of 1 to 20 microns. In other embodiments, the yttrium containing aerosol deposition coating 212 has a thickness in the range of 1 to 10 microns. In various embodiments, the aluminum oxide aerosol deposition coating 208 has a thickness in the range of 1 to 20 microns. In other embodiments, the aluminum oxide aerosol deposition coating 208 has a thickness in the range of 1 to 10 microns. Generally, the aluminum oxide aerosol deposition coating is an aluminum oxide containing aerosol deposition coating. However, an aluminum oxide containing aerosol deposition coating may further comprise other materials or impurities.

Figure 3:
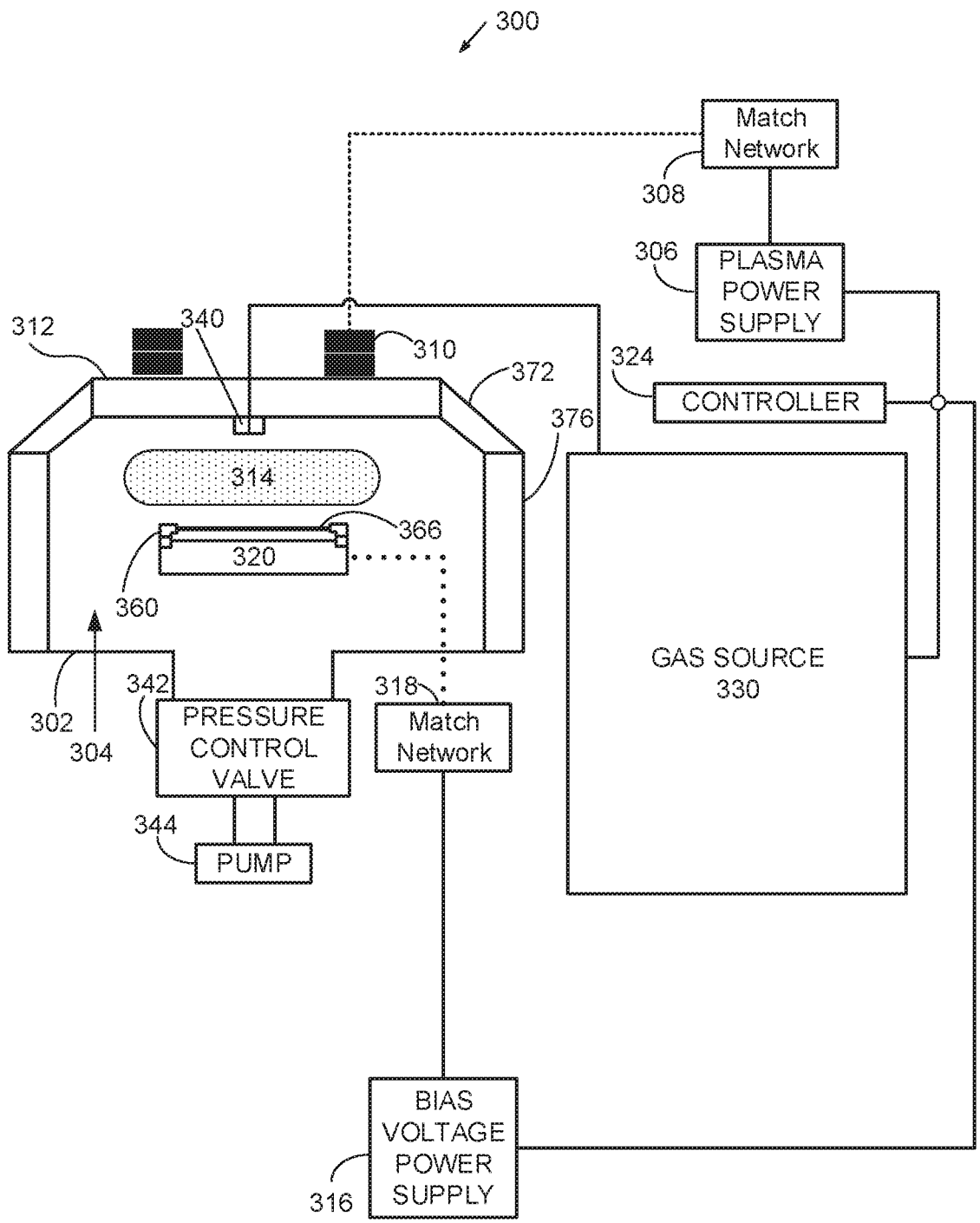
FIG. 3 is a schematic view of a plasma processing chamber that may be used in an embodiment.

FIG. 3 schematically illustrates an example of a plasma processing chamber 300. The plasma processing chamber 300 may be used in an embodiment. The plasma processing chamber 300 includes a plasma reactor 302 having a plasma processing confinement chamber 304 therein. A plasma power supply 306, tuned by a match network 308, supplies power to a transformer coupled plasma (TCP) coil 310 located near a power window 312 to create a plasma 314 in the plasma processing confinement chamber 304 by providing an inductively coupled power. A pinnacle 372 extends from a chamber wall 376 of the plasma processing confinement chamber 304 to the power window 312 forming a pinnacle ring. The pinnacle 372 is angled with respect to the chamber wall 376 and the power window 312, such that the interior angle between the pinnacle 372 and the chamber wall 376 and the interior angle between the pinnacle 372 and the power window 312 are each greater than 90° and less than 180°. The pinnacle 372 provides an angled ring near the top of the plasma processing confinement chamber 304, as shown. The TCP coil (upper power source) 310 may be configured to produce a uniform diffusion profile within the plasma processing confinement chamber 304. For example, the TCP coil 310 may be configured to generate a toroidal power distribution in the plasma 314. The power window 312 is provided to separate the TCP coil 310 from the plasma processing confinement chamber 304 while allowing energy to pass from the TCP coil 310 to the plasma processing confinement chamber 304. A wafer bias voltage power supply 316 tuned by a match network 318 provides power to an electrode 320 to set the bias voltage on the substrate 366. The substrate 366 is supported by the electrode 320. A controller 324 sets points for the plasma power supply 306 and the wafer bias voltage power supply 316.

The plasma power supply 306 and the wafer bias voltage power supply 316 may be configured to operate at specific radio frequencies such as, for example, 13.56 megahertz (MHz), 27 MHz, 2 MHz, 60 MHz, 400 kilohertz (kHz), 2.54 gigahertz (GHz), or combinations thereof. Plasma power supply 306 and wafer bias voltage power supply 316 may be appropriately sized to supply a range of powers in order to achieve desired process performance For example, in one embodiment, the plasma power supply 306 may supply the power in a range of 50 to 5000 Watts, and the wafer bias voltage power supply 316 may supply a bias voltage of in a range of 20 to 2000 volts (V). In addition, the TCP coil 310 and/or the electrode 320 may be comprised of two or more sub-coils or sub-electrodes. The sub-coils or sub-electrodes may be powered by a single power supply or powered by multiple power supplies.

As shown in FIG. 3, the plasma processing chamber 300 further includes a gas source/gas supply mechanism 330. The gas source 330 is in fluid connection with plasma processing confinement chamber 304 through a gas inlet, such as a gas injector 340. The gas injector 340 may be located in any advantageous location in the plasma processing confinement chamber 304 and may take any form for injecting gas. Preferably, however, the gas inlet may be configured to produce a "tunable" gas injection profile. The tunable gas injection profile allows independent adjustment of the respective flow of the gases to multiple zones in the plasma process confinement chamber 304. More preferably, the gas injector is mounted to the power window 312, The mounting of the gas injector to the power window 312 means the gas injector may be mounted on, mounted in, or form part of the power window. The gas source/gas supply mechanism 330 is controlled by the controller 324. A pressure control valve 342 and a pump 344 are in fluid connection with the plasma processing confinement chamber 304. The process gases and by-products are removed from the plasma process confinement chamber 304 via the pressure control valve 342 and the pump 344. The gas pressure control valve 342 and pump 344 also serve to maintain a particular pressure within the plasma processing confinement chamber 304. The pressure control valve 342 can maintain a pressure of less than 1 torr during processing. An edge ring 360 is placed around the substrate 366. A Kiyo by Lam Research Corp. of Fremont, Calif., may be used to practice an embodiment.

In various embodiments, the component may be different parts of a plasma processing confinement chamber 304, such as confinement rings, edge rings 360, the pinnacle 372, an electrostatic chuck, the electrode 320, ground rings, chamber liners, door liners, or other components. Other components of other types of plasma processing chambers may be used. For example, plasma exclusion rings on a bevel etch chamber may be coated in an embodiment. In another example, the plasma processing chamber may be a dielectric processing chamber or conductor processing chamber. In some embodiments, one or more, but not all surfaces are coated.

While this disclosure has been described in terms of several preferred embodiments, there are alterations, permutations, modifications, and various substitute equivalents, which fall within the scope of this disclosure. It should also be noted that there are many alternative ways of implementing the methods and apparatuses of the present disclosure. It is therefore intended that the following appended claims be interpreted as including all such alterations, permutations, and various substitute equivalents as fall within the true spirit and scope of the present disclosure.

What is claimed is:

1. An apparatus adapted for use in a plasma processing chamber, the apparatus comprising:
   an aluminum body with at least one surface;
   an $Al_2O_3$ aerosol deposition coating disposed over the at least one surface of the aluminum body to form an aluminum oxide coating; and
   an yttrium containing aerosol deposition coating comprising yttrium aluminum oxide disposed over the $Al_2O_3$ aerosol deposition coating.

2. The apparatus, as recited in claim 1, wherein the yttrium containing aerosol deposition coating has a thickness in a range of 1 to 20 microns.

3. The apparatus, as recited in claim 2, wherein the $Al_2O_3$ aerosol deposition coating has a thickness in a range of 1 to 20 microns.

4. The apparatus, as recited in claim 1, wherein the apparatus is at least one of a confinement ring, an edge ring, a pinnacle, an electrostatic chuck, an electrode, a ground ring, a chamber liner, and a door liner.

5. The apparatus, as recited in claim 1, wherein the at least one surface of the aluminum body has a surface roughness of no more than 16 Ra (microinches).

6. The apparatus, as recited in claim 1, wherein the aluminum body is at least 95% pure aluminum by weight.

7. The apparatus, as recited in claim 1, wherein the $Al_2O_3$ aerosol deposition coating functions as an anchoring layer to provide adhesion for the yttrium containing aerosol deposition coating.

8. The apparatus, as recited in claim 1, wherein the $Al_2O_3$ aerosol deposition coating functions as a diffusion barrier protecting against wet chemistries.

* * * * *